United States Patent
Jung et al.

(10) Patent No.: US 7,730,849 B2
(45) Date of Patent: Jun. 8, 2010

(54) APPARATUS FOR COATING PHOTORESIST MATERIAL

(75) Inventors: Hun Rock Jung, Gyeonggi-do (KR); Hee Sung Kim, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 602 days.

(21) Appl. No.: 11/399,875

(22) Filed: Apr. 7, 2006

(65) Prior Publication Data
US 2007/0169690 A1  Jul. 26, 2007

(30) Foreign Application Priority Data
Jan. 23, 2006  (KR) .................. 10-2006-0006981

(51) Int. Cl.
  *B05B 15/02*  (2006.01)
  *B05B 3/00*  (2006.01)
  *B05C 11/02*  (2006.01)
(52) U.S. Cl. .............. 118/302; 118/326; 118/323; 118/52; 118/602; 239/106
(58) Field of Classification Search .......... 118/302, 118/326, 52, 612, 313, 319, 320, 56, 321, 118/323, 602; 239/104, 106, 120–122; 134/153, 134/198, 902; 396/604, 611, 627; 427/240
See application file for complete search history.

(56) References Cited

U.S. PATENT DOCUMENTS

| 7,153,364 | B1 * | 12/2006 | Rangarajan et al. | ......... 118/326 |
| 2005/0188919 | A1 * | 9/2005 | Nguyen | ...................... 118/300 |

FOREIGN PATENT DOCUMENTS

JP  2000164491 A  6/2000

\* cited by examiner

*Primary Examiner*—Yewebdar T Tadesse
(74) *Attorney, Agent, or Firm*—Townsend and Townsend and Crew LLP

(57) ABSTRACT

An apparatus for providing a photoresist material onto a substrate includes a lid housing at least one nozzle. A solvent supplying port inputs the solvent into the apparatus. A first solvent trap is provided below the nozzle and coupled to the solvent supplying port to hold a given amount of the solvent being input from the solvent supplying port. The first solvent trap is configured to prevent photoresist residues on the nozzle from being converted to powders. A second solvent trap is provided below the first solvent trap to receive the solvent from the first solvent trap. A solvent path is provided between the solvent trap and the solvent container to guide the solvent from the first solvent trap to the second solvent trap.

18 Claims, 2 Drawing Sheets

APPARATUS FOR COATING PHOTORESIST MATERIAL

BACKGROUND OF THE INVENTION

The present invention relates to an apparatus for coating or applying photoresist material onto a wafer or substrate.

Generally, the coating material is in liquid state. A conventional photoresist material having a protection group such as t-BOC and acetal does not harden easily when compared to a photoresist material for use with the ArF laser. As a result, the photoresist hardening phenomenon, which causes photoresist powder drops or coating failure during a coating process, generally does not occur when such a conventional photoresist material is used in a coating apparatus having a conventional solvent bath. However, it is somewhat difficult to use the conventional photoresist material including a polyhydroxystyrene-based polymer for forming an ultra fine pattern because it absorbs the ArF laser (193 nm wavelength). Accordingly, the researchers have been trying to find a replacement photoresist material that would be suitable for use with the ArF laser.

Generally, a suitable polymer for the ArF laser should be transparent, have good tolerance to dry etching, and be good adherent. A photoresist material having an aromatic ring structure that is for KrF laser has good tolerance to dry etching, but the aromatic ring structure absorbs 193 nm wavelength light. As a result, a promising photoresist material for the ArF laser has been developed by adding an alicyclic group structure to a metahacrylate polymer.

FIG. 1 is a simplified cross-sectional view showing a conventional apparatus for coating a photoresist material onto a substrate or wafer.

The apparatus includes a nozzle 11, a solvent bath 25, a lid 13, a solvent supplying port 15, a solvent pipeline 17, a solvent trap 19, a solvent fume trap 21 and a solvent drain member 23. Here, the nozzle 11 is used to inject the photoresist material onto a wafer (not shown). The lid 13 has one or more nozzle holders having a nozzle tip cover 13C for housing the nozzle 11. The nozzle holder exposes only the edge of the nozzle 11. Also, the solvent pipeline 17 is provided under the lid 13 to guide the solvent supplied to a solvent bath 25 to the solvent drain member 23. Here, the solvent trap 19 is configured to hold solvent and prevent the photoresist residue in the nozzle 11 from being hardened, e.g., by using the fumes from the solvent being held in the solvent trap 19. The solvent supplying port 15 is provided adjacent to the solvent trap 19 to supply the solvent to the solvent bath 25. The solvent fume trap 21 is provided near to the top of the solvent pipeline 17 to store fumes generated from the solvent trap 19. Accordingly, both the solvent trap 19 and the solvent fume trap 21 are configured to prevent the photoresist residue in the nozzle 11 from being hardened.

According to the above apparatus, the solvent fume trap 21 does not effectively secure the fumes. Since the solvent trap 19 is provided at a significant distance away (e.g., 45 mm) from the lower surface of the nozzle 11, it is difficult to effectively prevent the photoresist material from being hardened. As a result, the coating failure may occur due to discoloring of the photoresist material and/or dropping of the hardened photoresist material (i.e., photoresist powders) on the wafer during the coating process.

BRIEF SUMMARY OF THE INVENTION

According to the present invention, an apparatus for coating or applying photoresist material onto a wafer or substrate is provided. In one embodiment, the apparatus has a modified solvent bath. The apparatus has a first solvent trap that is provided in close proximity to a nozzle, and a lid of the solvent bath is modified to substantially expose the nozzle, thereby preventing the photoresist residue in the nozzle from being hardened.

In one embodiment, an apparatus for providing a photoresist material onto a substrate includes a lid that houses at least one nozzle. A solvent supplying port inputs the solvent into the apparatus. A first solvent trap is provided below the nozzle and coupled to the solvent supplying port to hold a given amount of the solvent being input from the solvent supplying port. The first solvent trap is configured to prevent photoresist residues on the nozzle from being converted to powders. A second solvent trap is provided below the first solvent trap to receive the solvent from the first solvent trap. A solvent path is provided between the first solvent trap and the second solvent trap to guide the solvent from the first solvent trap to the second solvent trap.

In one embodiment, an apparatus for providing a photoresist material onto a substrate includes a lid housing at least one nozzle; a solvent supplying port to provide the solvent to the apparatus; a solvent pipeline to receive the solvent from the solvent supplying port and guide the solvent to a solvent drain member; and a first solvent trap provided below the nozzle and coupled to the solvent supplying port to hold a given amount of the solvent being received from the solvent supplying port, the first solvent trap being provided proximate an upper portion of the solvent pipeline and substantially surrounding the upper portion of the solvent pipeline. The first solvent trap is configured to prevent photoresist residues on the nozzle from being converted to powders.

The nozzle holder has a sloping shape to enlarge an opening defined by the nozzle holder, the opening exposing the nozzle provided between the nozzle holder. The vapor from the solvent trapped in the first solvent trap prevents the photoresist residues on the nozzle from hardening and being converted to the powders. In another embodiment, an apparatus for coating a photoresist material onto a substrate includes a lid having one or more nozzle holders to house a nozzle; a solvent pipeline provided below the lid to guide the solvent to a solvent drain member; a solvent supplying port to supply the solvent; and a first solvent trap provided below the nozzle and configured to receive the solvent from the solvent supplying port and hold the solvent therein to prevent photoresist residues on the nozzle from hardening. The first solvent trap is configured so that the solvent being held in the first solvent trap is no more than 40 mm from a lower end of the nozzle.

In another embodiment, an apparatus for coating a photoresist material includes a solvent pipeline provided below the lid to guide the solvent to a solvent drain member, a solvent supplying port provided at a side of the solvent pipeline to supply the solvent, a first solvent trap provided between the solvent supplying port and the solvent pipeline to trap the solvent supplied from the solvent supplying port, and a second solvent trap coupled to the solvent pipeline and provided between the first solvent trap and the solvent drain member to trap the solvent received from the solvent pipeline.

DETAILED DESCRIPTION OF THE INVENTION

Reference will now be made in detail to exemplary embodiments of the present invention. Wherever possible, the same reference numbers will be used throughout the drawings to refer to the same or like parts. It should be appreciated that the embodiments are provided to describe and enable the invention to those skilled in the art. Accordingly, the embodiments described herein may be modified without departing from the scope of the present invention.

Figure 1:
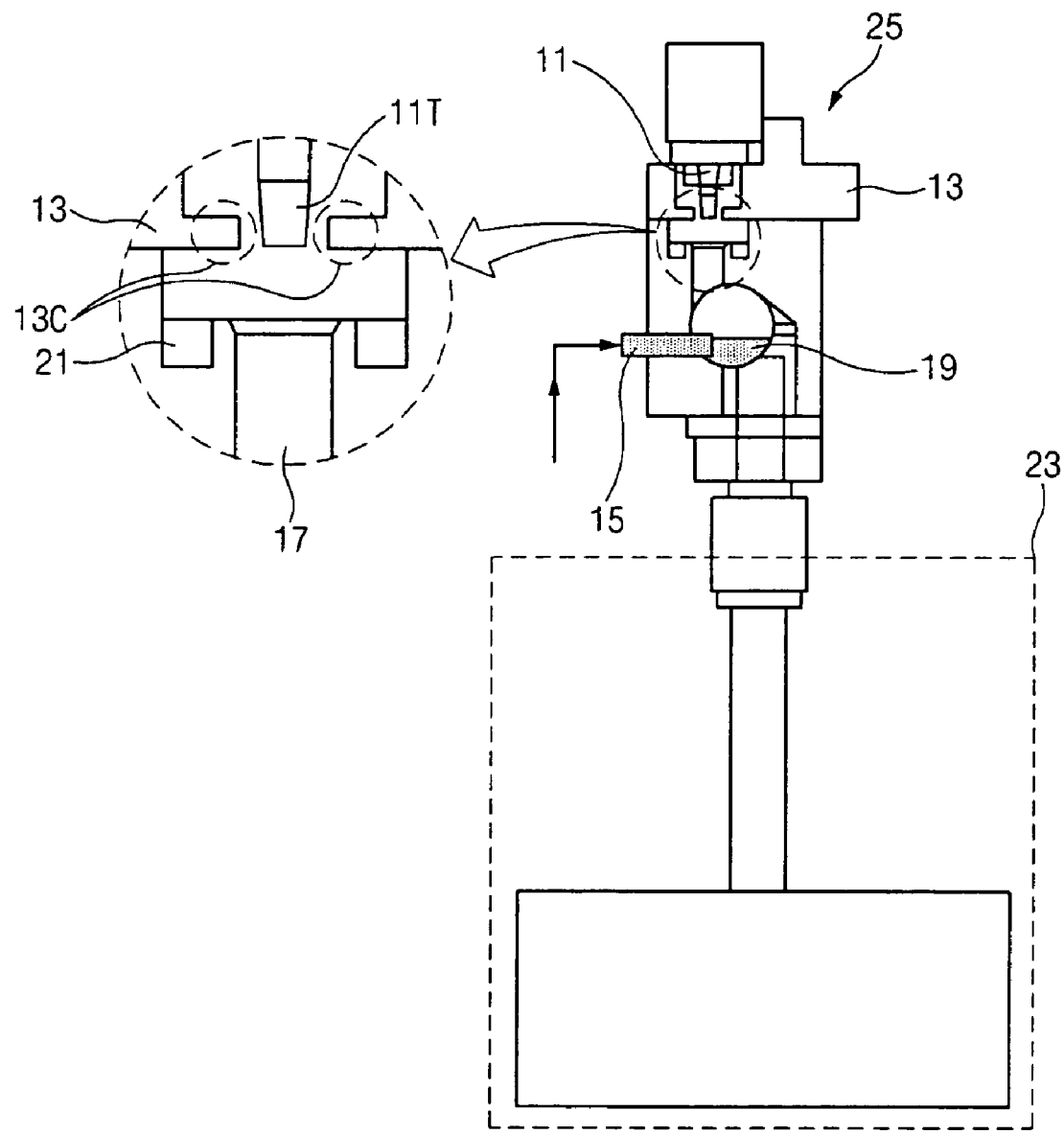
FIG. 1 is a simplified cross-sectional view showing an apparatus for coating a photoresist material.
Figure 2:
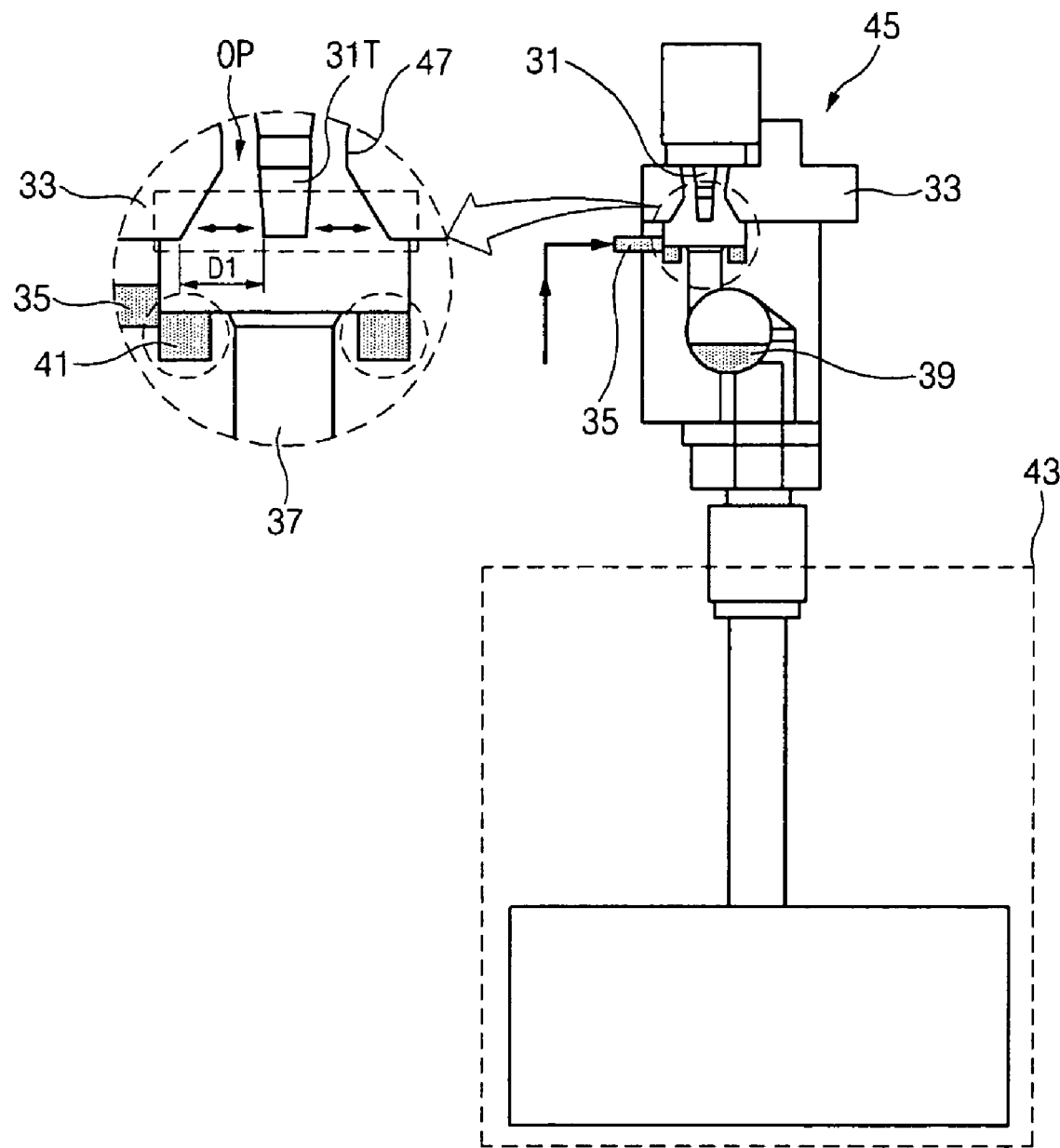
FIG. 2 is a simplified cross-sectional view showing an apparatus for coating a photoresist material in accordance with an embodiment of the present invention.

FIG. 2 is a simplified cross-sectional view showing an apparatus for applying photoresist material onto a substrate in accordance with an embodiment of the present invention. The apparatus comprises a nozzle 31, a solvent bath 45, a lid 33, a solvent supplying port 35, a solvent pipeline 37, a first solvent trap 41, a second solvent trap 39 and a solvent drain member 43. During the coating operation, the nozzle 31 is placed over a wafer (not shown) to inject or apply the photoresist material on the wafer. Between coating operations, the nozzle is placed over the first and second solvent traps of the solvent bath. The fumes from the solvent traps prevent the photoresist residues on the nozzle from hardening and being converted to powders that may drop on the wafer during the subsequent coating operation.

In the present embodiment, the lid 33 includes one or more nozzle holders 47 for housing the nozzle 31 and providing the nozzle 31 over the first and second solvent traps, and consequently the solvent in a solvent bath 45. Also, the solvent pipeline or path 37 is provided under the lid 33 to guide the solvent received from the solvent supplying port 35 to the solvent drain member 43.

The solvent supplying port 35 is provided at a side of the solvent pipeline 37 to supply the solvent into the solvent bath 45. Preferably, the solvent supplying port 35 is provided in close proximity to the first solvent trap 41. In one implementation, the solvent supplying port 35 is provided closer to a tip 31T of the nozzle 31 than the second solvent trap 39. In alternative or in combination, the solvent supplying port 35 is provided closer to the first solvent trap 41 than the second solvent trap 39, e.g., the first solvent trap is provided at about the same level or slightly above the first solvent trap 41. As one implementation, the supplying port 35 is provided at 30 mm or less, 20 mm or less, or 10 mm or less from a lower end of the nozzle 31. The solvent supplying port 35 is provided in close proximity to the nozzle tip 31T to enable the nozzle tip 31T to more easily receive the solvent fumes, so that the photoresist residues on the nozzle tip 31T may be prevented from being hardened.

The first solvent trap 41 is configured to trap the solvent received from the solvent supplying port 35 as the solvent is being input to the solvent bath 45. The first solvent trap 41 is configured to surround (or substantially surround) the outside of the solvent pipeline 37 and provided between the solvent supplying port 35 and the solvent pipeline 37 in the present implementation. Preferably, the top surface of the first solvent trap 41 is provided at about the same level as the top surface of the solvent pipeline 37.

In one implementation, the first solvent trap 41 traps the solvent supplied from the solvent supplying port 35 until the first solvent trap 41 is filled. The excess solvent is then inputted to the solvent drain member 23 via the solvent pipeline 37. The fume (or vapor) from the trapped solvent in the first solvent trap 41 prevents the formation of photoresist powders on the surface of the lid 33 and the edge of the nozzle 31.

In the present embodiment, the holders 47 define an opening that slope outward to provide a large opening OP for the nozzle tip 31T. This increased distance between the nozzle 31 and the nozzle holder 47 is illustrated by the arrows in FIG. 2. The maximum distance D1 (i.e., the lateral distance defined at the lowest level on the nozzle tip) between the nozzle 31 and the inner edge of the nozzle holder 47 ranges about 5 mm to about 10 mm. Accordingly, the opening OP defined by the nozzle holders is D1+D1+the width of the nozzle tip 31. The opening OP may be larger if the nozzle holders extend below the nozzle tip 31T.

The second solvent trap 39 is provided between the solvent supplying port 35 and the solvent drain member 43. In the present embodiment, the second solvent trap 39 is provided in or connected to the solvent pipeline 37 to trap the solvent as it flows down to the solvent drain member 43 via the solvent pipeline 37. The second solvent trap is configured to trap a predetermined volume of the solvent. Among other reasons, the solvent in the second solvent trap helps prevent the residues of photoresist material in or on the nozzle 31 from hardening. The solvent is periodically supplied from the solvent supplying port 35 so as to maintain a certain volume of the solvent in the solvent bath 45. In the present implementation, the second solvent trap 39 and the solvent supplying port 35 is separated by at least 50 mm to provide the supplying port 35 closer to the nozzle 31.

As described above, according to the present invention, a first solvent trap 41 for trapping the solvent supplied to a solvent bath 45 is provided in close proximity (to a lower end of the nozzle 31. In one implementation, the first solvent trap 41 is configured, so that the solvent being held in the first solvent trap 41 is no more than 40 mm, or 30 mm, or 20 mm, or 10 mm from the lower end of the nozzle 31. The lid 33 of the solvent bath 45 is modified so as to expose the nozzle to a greater degree, thereby preventing the formation of photoresist powders on the surface of the nozzle and the lid from.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. An apparatus for coating a photoresist material onto a substrate, the apparatus comprising:

a lid having one or more nozzle holders to house a nozzle;

a solvent pipeline provided below the lid to guide the solvent to a solvent drain member;

a solvent supplying port to supply the solvent into the solvent pipeline;

a first solvent trap provided below the nozzle and configured to trap the solvent supplied by the solvent supplying port and prevent the formation of powders on the lid or the nozzle or both;

a second solvent trap coupled to the solvent pipeline to trap the solvent received from the solvent pipeline; and the solvent drain member configured to receive the solvent from the second solvent trap, wherein the solvent supplying port is provided closer to the first solvent trap than the second solvent trap, the nozzle being positioned over the first and second solvent traps between coating operations.

2. The apparatus according to claim 1, wherein the nozzle holder has a sloping shape to enlarge an opening defined by the nozzle holder, the opening exposing the nozzle provided between the nozzle holder.

3. The apparatus according to claim 1, wherein the first solvent trap is configured to surround the outside of the solvent pipeline and provided between the solvent supplying port and the solvent pipeline.

4. The apparatus according to claim 1, wherein an upper surface of the first solvent trap is in close proximity to a lower surface of the nozzle.

5. The apparatus according to claim 1, wherein an upper surface of the solvent supplying port is provided at about the same level or above an upper surface of the first solvent trap.

6. The apparatus of claim 1, the solvent supplying port is provided at no more than 20 mm in a vertical direction from a lower end of the nozzle.

7. The apparatus of claim 1, wherein the solvent supplying port is provided closer to the nozzle than the second solvent trap.

8. The apparatus of claim 7, wherein the powders on the nozzle are formed by hardening of photoresist residues on the nozzle, and the vapor from the solvent trapped in the first solvent trap prevents the photoresist residues on the nozzle from hardening and being converted to the powders.

9. The apparatus of claim 1, wherein the first solvent trap is configured to trap a given amount of the solvent as the solvent is being input into the solvent bath by the solvent supplying port, the solvent bath including the first solvent trap, the solvent pipeline, and the second solvent trap.

10. An apparatus for providing a photoresist material onto a substrate, the apparatus comprising:
a lid housing at least one nozzle;
a solvent supplying port to input the solvent into the apparatus;
a solvent pipeline to receive the solvent from the solvent supplying port and guide the solvent to a solvent drain member;
a first solvent trap provided below the nozzle and coupled to the solvent supplying port to hold a given amount of the solvent being input from the solvent supplying port, the first solvent trap being provided proximate an upper portion of the solvent pipeline and substantially surrounding the upper portion of the solvent pipeline;
a second solvent trap provided below the first solvent trap to receive the solvent from the first solvent trap via the solvent pipeline; and
the solvent drain member configured to receive the solvent from the second solvent trap,
wherein the first solvent trap is configured to prevent photoresist residues on the nozzle from being converted to powders, the nozzle being positioned over the first and second solvent traps between coating operations.

11. The apparatus of claim 10, wherein the solvent supplying port is provided closer to the nozzle than the second solvent trap in vertical direction.

12. The apparatus of claim 10, wherein the lid includes first and second sidewalls defining an opening, so that the nozzle is exposed to a solvent vapor from the solvent trapped in the first solvent trap.

13. The apparatus of claim 12, wherein the first and second sidewalls slope outward to provide a larger opening area for the opening and facilitate the exposure of the nozzle to the solvent vapor.

14. The apparatus of claim 12, wherein the lid includes nozzle holders, the nozzle holders including the first and second sidewalls.

15. An apparatus for coating a photoresist material onto a substrate, the apparatus comprising:
a lid having one or more nozzle holders to house a nozzle;
a solvent pipeline provided below the lid to guide the solvent to a solvent drain member;
a solvent supplying port to supply the solvent;
a first solvent trap provided below the nozzle and configured to receive the solvent from the solvent supplying port and hold the solvent therein to prevent photoresist residues on the nozzle from hardening;
a second solvent trap coupled to the solvent pipeline to trap the solvent received from the first solvent trap via the solvent pipeline; and
the solvent drain member configured to receive the solvent from the second solvent trap,
wherein the first solvent trap is configured so that the solvent being held in the first solvent trap is no more than 40 mm from a lower end of the nozzle, the nozzle being positioned over the first and second solvent traps between coating operations.

16. The apparatus of claim 15, wherein the lid having an opening for the nozzle that extends outward, wherein the first solvent trap is configured so that the solvent held in the first solvent trap is no more than 30 mm from a lower end of the nozzle.

17. The apparatus of claim 15, wherein the lid having an opening for the nozzle that extends outward, wherein the first solvent trap is configured so that the solvent held in the first solvent trap is no more than 20 mm from a lower end of the nozzle.

18. The apparatus of claim 15,
wherein the solvent supplying port is provided closer to the first solvent trap than the second solvent trap.

* * * * *